(12) United States Patent
Shaikh

(10) Patent No.: US 9,859,088 B2
(45) Date of Patent: Jan. 2, 2018

(54) INTER-ELECTRODE GAP VARIATION METHODS FOR COMPENSATING DEPOSITION NON-UNIFORMITY

(71) Applicant: Lam Research Corporation, Fremont, CA (US)

(72) Inventor: Fayaz Shaikh, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 137 days.

(21) Appl. No.: 14/701,479

(22) Filed: Apr. 30, 2015

(65) Prior Publication Data

US 2016/0322215 A1    Nov. 3, 2016

(51) Int. Cl.
*C23C 16/50* (2006.01)
*H01J 37/00* (2006.01)
*C23C 16/455* (2006.01)
*C23C 16/505* (2006.01)

(52) U.S. Cl.
CPC ........ *H01J 37/00* (2013.01); *C23C 16/45565* (2013.01); *C23C 16/45587* (2013.01); *C23C 16/505* (2013.01)

(58) Field of Classification Search
CPC ...... C23C 16/50; C23C 16/509; C23C 16/511
See application file for complete search history.

(56) References Cited

U.S. PATENT DOCUMENTS 6,625,004 B1 * 9/2003 Musolf ................ B82Y 30/00
361/277
7,615,931 B2 * 11/2009 Hooke ................ A61L 2/0011
118/723 E
2003/0031792 A1 * 2/2003 Won ................... C23C 16/4581
427/255.28
2006/0191637 A1 * 8/2006 Zajac ................. B81C 1/00547
156/345.34
2006/0244386 A1 * 11/2006 Hooke ................ A61L 2/0011
315/111.21

(Continued)

OTHER PUBLICATIONS

Ponomarev, A.V., et al., "High-voltage electrode optimization towards uniform surface treatment by a pulsed volume discharge". 12th International Conference on Gas Discharge Plasmas and Their Applications. Journal of Physics: Conference Series 652 (2015) 012035, pp. 1-7.*

*Primary Examiner* — Bret Chen
(74) *Attorney, Agent, or Firm* — Martine Penilla Group, LLP

(57) ABSTRACT

A method for depositing material layers with gap variation between film deposition operations is provided. A material layer is deposited over a substrate and is performed in a plasma chamber having a bottom electrode and a top electrode. The method sets a first gap between the bottom and top electrodes and performs plasma deposition to deposit a first film of the material layer over the substrate while the first gap is set between the bottom and top electrodes. Setting a second gap between the bottom a top electrodes and performs plasma deposition to deposit a second film of the material layer over the substrate while the second gap is set between the bottom and top electrodes. The material layer is from the first and second films and the first gap is varied to the second gap to offset pre-characterized non-uniformities when depositing the first film followed by the second film.

10 Claims, 9 Drawing Sheets

(56) References Cited

U.S. PATENT DOCUMENTS

2013/0052369 A1\* 2/2013 Salabas ............. H01J 37/32449
 427/569
2013/0313480 A1\* 11/2013 Dubreuil .................. B05D 1/62
 252/301.16

\* cited by examiner

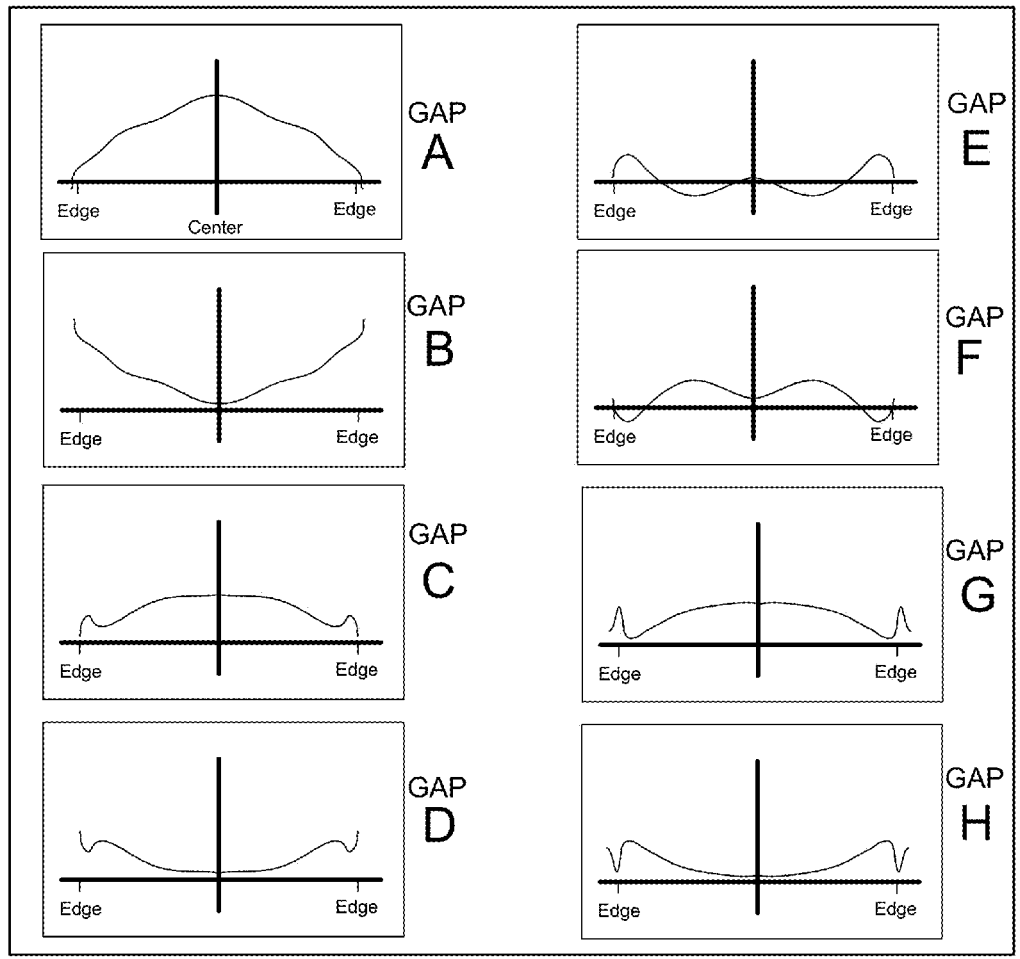
FIG. 5 Non-Uniformity Profiles
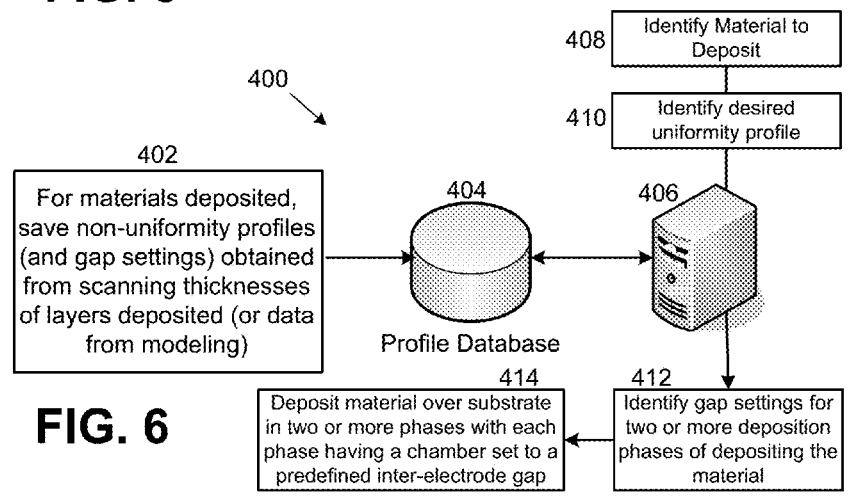
FIG. 6

INTER-ELECTRODE GAP VARIATION METHODS FOR COMPENSATING DEPOSITION NON-UNIFORMITY

BACKGROUND

1. Field of the Invention

The present embodiments relate to semiconductor wafer processing equipment tools, and more particularly, methods for depositing material layers with varying gap settings between electrodes.

2. Description of the Related Art

Some semiconductor processing systems may employ plasma when depositing thin films on a substrate in a processing chamber. Generally, the substrate is arranged on a pedestal in the processing chamber. To create the thin film using chemical vapor deposition, one or more precursors are supplied by a showerhead to the processing chamber.

During processing, radio frequency (RF) power may be supplied to the showerhead or to an electrode to create plasma. For example, RF power may be supplied to the electrode embedded in a pedestal platen, which may be made of a non-conducting material such as ceramic. Another conducting portion of the pedestal may be connected to RF ground or another substantially different electrical potential.

When the electrode is excited by the RF power, RF fields are generated between the substrate and the showerhead to create plasma between the wafer and the showerhead. Plasma-enhanced chemical vapor deposition (PECVD) is a type of plasma deposition that is used to deposit thin films from a gas state (i.e., vapor) to a solid state on a substrate such as a wafer. PECVD systems convert a liquid precursor into a vapor precursor, which is delivered to a chamber.

Generally speaking, chambers used to deposit material layers implement settings that are fixed during a time when the material layer is deposited. The settings may include gas supply settings, power levels supplied, pressure settings and temperature settings and relative electrode positioning. As wafer sizes continue to increase however, it has been discovered that more non-uniformities may occur radially across the surface of the substrate. Often, analysis of deposited materials exhibit more uniformities near the wafer edge and sometimes in the center wafer region. Unfortunately, non-uniformities tend to reduce yield, especially near the wafer edge.

It is in this context that inventions arise.

SUMMARY

Embodiments of the disclosure provide methods that enable varying inter-electrode gap to compensate for radial non-uniformity of deposition thickness profiles in capacitive coupled plasma enhanced chemical vapor deposition (PECVD) and atomic layer deposition (ALD) chambers. In some embodiments, the varying of inter-electrode gap is configured to occur during one or more phases of depositing a material layer. For example, as films are formed to define the material layer, the inter-electrode gap may be changed, so as to affect the deposition profile and improve radial uniformity of the resulting material layer formed by the two or more film depositing phases. In some embodiments, the material layer is deposited for a percentage of time of the total targeted material layer film thickness using a first gap between a top and bottom electrode and then for a remaining percentage of time of the total targeted material layer film thickness a second gap is implemented.

In one configuration, a plurality of gaps are tested by scanning/measuring deposited materials on test wafers. The resulting film thickness uniformity or non-uniformity profiles are stored for each of the tested gaps. In some embodiments, different gaps produce different film thickness uniformity profiles. In some cases, different gaps for the same process may produce opposite or at least partially symmetric but opposite non-uniform thickness profile (e.g., positive non-uniformities vs. negative non-uniformities or thick-center profile vs. thin-center profile). With this information, a process engineer can define a recipe that selects gaps settings and varies the gap during the deposition profile so as to offset or cancel out the expected thickness non-uniformities. In one embodiment, a capacitively coupled plasma (CCP) PECVD system includes a pedestal (usually ground electrode, but can be RF electrode) that is capable of being adjusted in position (vertically) so the gap between the top and bottom electrodes is optimized for a process In one embodiment, when the pedestal is movable and is controllable through equipment control, the inter-electrode gap can be made dynamic during a process or be varied through multiple depositions. With dynamic inter-electrode gap variation, the deposition thickness radial profile can be engineered by depositing parts of the films with varying gap and the profiles can be created in such a way as to cancel out the salient thickness non-uniformities to give a more uniform film. In one configuration, it is possible to modulate the deposition radial profile using varying gap during a process deposition or during multiple depositions on same or different deposition stations.

Methods and systems for depositing material layers with gap variation between film deposition operations are provided. The method includes depositing a material layer over a substrate. The depositing is performed in a plasma chamber having a bottom electrode and a top electrode. The method includes providing a substrate over the bottom electrode in the plasma chamber. The method sets a first gap between the bottom and top electrodes and performs plasma deposition to deposit a first film of the material layer over the substrate while the first gap is set between the bottom and top electrodes. The method then sets a second gap between the bottom a top electrodes and performs plasma deposition to deposit a second film of the material layer over the substrate while the second gap is set between the bottom and top electrodes. The material layer is defined by the first and second films and the first gap is varied to the second gap to offset at least some of the expected non-uniformities when depositing the first film followed by the second film.

In another embodiment, a method for processing a substrate to deposit a material layer over the substrate is provided. The method includes providing a plasma chamber having a substrate support electrode for supporting the substrate and a showerhead electrode arranged over the substrate support electrode. The method includes receiving a recipe for depositing the material layer over the substrate and identifying a first gap between the substrate support electrode and the showerhead electrode. The first gap is associated with a first uniformity profile. The method further includes identifying a second gap between the substrate support electrode and the showerhead electrode, where the second gap is associated with a second thickness uniformity profile. The method includes depositing a first film of the material layer while the plasma chamber is set to have the first gap and then depositing a second film of the material layer while the plasma chamber is set to have the second gap. The first uniformity profile is configured to have positive non-uniform characteristics or center-thick profile and the second uniformity profile is configured to have negative non-uniform or center-thin characteristics. These two or more profiles together can act to at least partially cancel each other to improve a global thickness uniformity of the deposited material layer across a surface of the substrate. In some embodiments, the positive (i.e., more deposition profile regions) may not exactly offset or cancel out the negative (i.e., less deposition profile regions). However, in some regions of the wafer, the offset or canceling can act to improve overall uniformity of a region or over some or all of the surface of the wafer.

In some embodiments, the method includes depositing the second film after varying between the first gap to the second gap.

In some embodiments, the method includes performing a plurality of deposition operations to deposit films on a test substrate to deposit the material layer. Each film is deposited using a different gap between the substrate support electrode and the showerhead electrode. The method includes identifying a uniformity profile for each of the deposition operations and saving the uniformity profile for each of the deposition operations to a database. The database includes corresponding gaps between the substrate support electrode and the showerhead electrode and uniformity profiles. The first and second gaps are associated with the first and second uniformity profiles.

In some embodiments, the method includes modeling a plurality of deposition operations to deposit films of the material layer. Each film is deposited using a different gap between the substrate support electrode and the showerhead electrode and saving a uniformity profile for each of the deposition operations to a database. The database includes corresponding data for gaps between the substrate support electrode and the showerhead electrode and uniformity profiles. The first and second gaps are associated with the first and second uniformity profiles.

In some embodiments, the positive and negative non-uniform characteristics are associated with near wafer edge and center wafer profile variations.

In some embodiments, the positive and negative thickness non-uniform characteristics include wing non-uniformities, or W-shaped non-uniformities, or valley-shaped non-uniformities, or dome-shaped non-uniformities, or ripple-shaped non-uniformities, or combinations of two or more thereof.

In some embodiments, the plasma chamber set to have first gap is a same plasma chamber that is then set to have the second gap.

In some embodiments, the plasma chamber set to have the first gap is different than the plasma chamber set to have the second gap.

In some embodiments, the substrate is moved to the plasma chamber having the second gap after depositing the first film in the chamber having the first gap, such that the second film is deposited in the plasma chamber having the second gap.

BRIEF DESCRIPTION OF THE DRAWINGS

FIG. 5 illustrates an example of a plurality of profiles produced when utilizing different gaps between electrodes, in accordance with one embodiment of the present invention.

FIG. 6 illustrates an example of a system that receives a plurality of non-uniformity (or uniformity) profiles for specific gap settings, as tested on a plurality of wafers for different deposited materials, and the utilizing of a profile database for selecting gaps based on desired uniformity profiles during two or more deposition phases for forming a material layer, in accordance with one embodiment of the present invention.

DESCRIPTION

Figure 1:
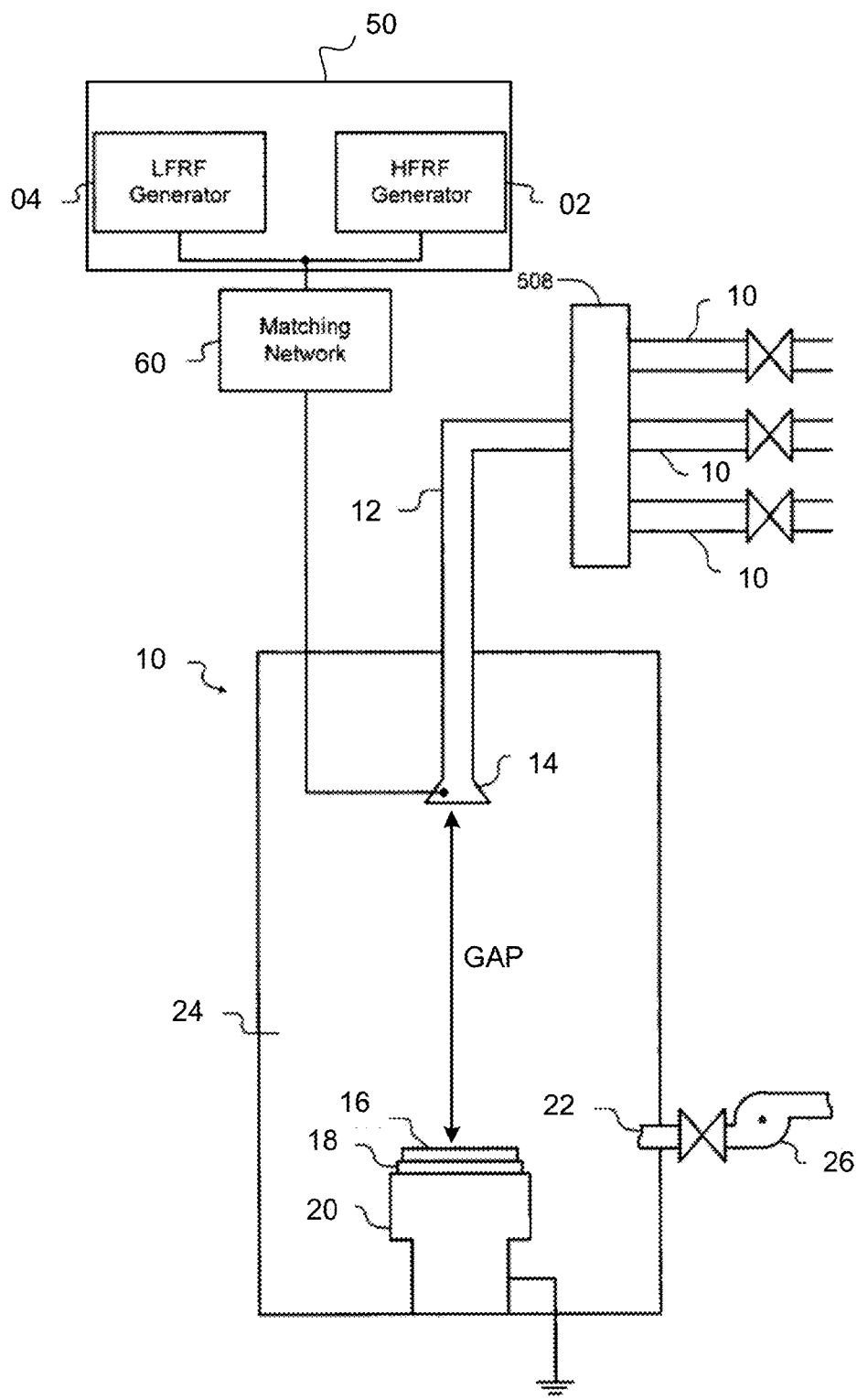
FIG. 1 illustrates a substrate processing system, which is used to process a wafer, e.g., to form films thereon.

Embodiments of the disclosure provide systems and methods for controlling and setting inter-electrode gap during processing or in between process steps or phases. The inter-electrode gap is variable to engineer the radial deposition profiles for uniformity improvement and/or to have a desired film profile. For a desired film profile, the profile need not be uniform, but may have a target profile. The deposition can be broken into multiple layers or films and each layer can be deposited with different inter-electrode gap and/or the gap can be varied to produce as resulting profile that is desirable.

In one embodiment, to improve on-wafer product yield, within-wafer (WiW) film thickness uniformity of PECVD or ALD deposited thin films needs to improve, especially up to and into the wafer edge exclusion region. Typically, for a given PECVD process, the inter-electrode gap, and other hardware geometry dimensions are optimized to give optimum deposition thickness uniformity. In a configuration where gas flows from the top electrode while it is powered with an RF voltage and bottom electrode acts as RF ground, there is usually a specific deposition profile that gets translated (e.g., imaged) to the wafer if the film thickness were measured linearly for thickness. Once measured, the a radial profile of the thickness can be symmetric or asymmetric (e.g., depending upon if the process and hardware is optimized for azimuthal uniformity, radial uniformity, or both). In this context, the radial profile is said to have a uniformity profile or non-uniformity profile. The radial profile can, for example, exhibit topographies along the measured line, which commonly portray recognizable shapes, e.g., wings at the edges, a W-shaped, a valley-shape, a dome-shape, to the other more extreme shapes.

In one embodiment, methods are provided to enable adjustment of the inter-electrode gap, statistically and dynamically, to manipulate the deposition radial profiles.

This manipulation, in one configuration can improve film uniformity or enable achievement of specific desired profiles. Accordingly, because different inter-electrode gaps can give different radial profiles, depositing portions of film with varying gap (or different gaps) can enable deposition of material layers with profiles that cancel out some of the effects of non-uniformities or undesired profiles.

In one configuration, the gap can be varied in a single deposition chamber tool. In another configuration, the gap can be set to different settings in each chamber of a multi-chamber tool. In the multi-chamber tool, a portion of the layer or material can be deposited in each chamber, e.g., by depositing a portion in one chamber station with a set profile (i.e., gap 1), and a portion in another chamber station with a set profile (i.e., gap 2). This process can be repeated for additional movements to station 3, station 4, or more stations is the tool allows, until the radial deposition profiles can cancel out or reduce the non-uniformities due to different gaps. As such, the disclosed process enables use of dynamic inter-electrode gap as uniformity improvement and/or radial-profile engineering knob. In some cases due to a certain etching radial profiles (usually one of the following steps in manufacturing), the deposited films are desired to have profiles that can cancel or minimize the effects of etching and this embodiments can also be used to design the profile of the film so that etching can be smoother. Broadly speaking, a desired profile can engineered (for better uniformity or for any other target profile) by using the variable gap during a deposition process or multiple depositions.

It should be appreciated that the present embodiments can be implemented in numerous ways, such as a process, an apparatus, a system, a device, or a method. Several embodiments are described below.

Deposition of films is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations. While in process, each wafer is held in place by a pedestal, wafer chuck and/or other wafer holding apparatus. For certain operations, the apparatus may include a heater such as a heating plate to heat the wafer.

FIG. 1 shows an exemplary CVD system. The deposition of film is preferably implemented in a plasma enhanced chemical vapor deposition (PECVD) system. The PECVD system may take many different forms. The PECVD system includes one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). A wafer undergoing deposition may be transferred from one station to another within a reactor chamber during the process. Of course, the film deposition may occur entirely at a single station or any fraction of the film may be deposited at any number of stations.

While in process, each wafer is held in place by a pedestal, wafer chuck and/or other wafer holding apparatus. For certain operations, the apparatus may include a heater such as a heating plate to heat the wafer. For example, a reactor 06 in FIG. 1 includes a process chamber 24, which encloses other components of the reactor and contains the plasma. The plasma may be generated by a capacitor type system including a showerhead 14 working in conjunction with a grounded heater block 20. A high-frequency RF generator 02, connected to a matching network 60, and a low-frequency RF generator 04 are connected to the showerhead 14. The power and frequency supplied by matching network 60 is sufficient to generate plasma from the process gas.

Within the reactor, a wafer pedestal 18 supports a substrate 16. The pedestal 18 typically includes a chuck, a fork, or lift pins to hold and transfer the substrate during and between the deposition and/or plasma treatment reactions. The chuck may be an electrostatic chuck, a mechanical chuck or various other types of chuck. The process gases are introduced via inlet 12. Multiple source gas lines 10 are connected to manifold 508. The gases may be premixed or not. Appropriate valving and mass flow control mechanisms are employed to ensure that the correct gases are delivered during the deposition and plasma treatment phases of the process.

Within the reactor, a wafer pedestal 18 supports a substrate 16. The pedestal 18 typically includes a chuck, a fork, or lift pins to hold and transfer the substrate during and between the deposition and/or plasma treatment reactions. The chuck may be an electrostatic chuck, a mechanical chuck or various other types of chuck. The process gases are introduced via inlet 12. Multiple source gas lines 10 are connected to manifold 08. The gases may be premixed or not. Appropriate valving and mass flow control mechanisms are employed to ensure that the correct gases are delivered during the deposition and plasma treatment phases of the process.

Process gases exit chamber 24 via an outlet 22. A vacuum pump 26 (e.g., a one or two stage mechanical dry pump and/or a turbomolecular pump) draws process gases out and maintains a suitably low pressure within the reactor by a close loop controlled flow restriction device, such as a throttle valve or a pendulum valve. It is possible to index the wafers after every deposition and/or post-deposition plasma anneal treatment until all the required depositions and treatments are completed, or multiple depositions and treatments can be conducted at a single station before indexing the wafer.

In one embodiment, the inter-electrode gap is illustrated between the showerhead 14 (powered top electrode), and the pedestal 18 (e.g., grounded electrode) over which the wafer 16 is placed. As described in more detail below, bottom electrode or top electrode may be vertically adjusted to change the gap, so as to set or achieve a desired uniformity profile during deposition.

Figure 2:
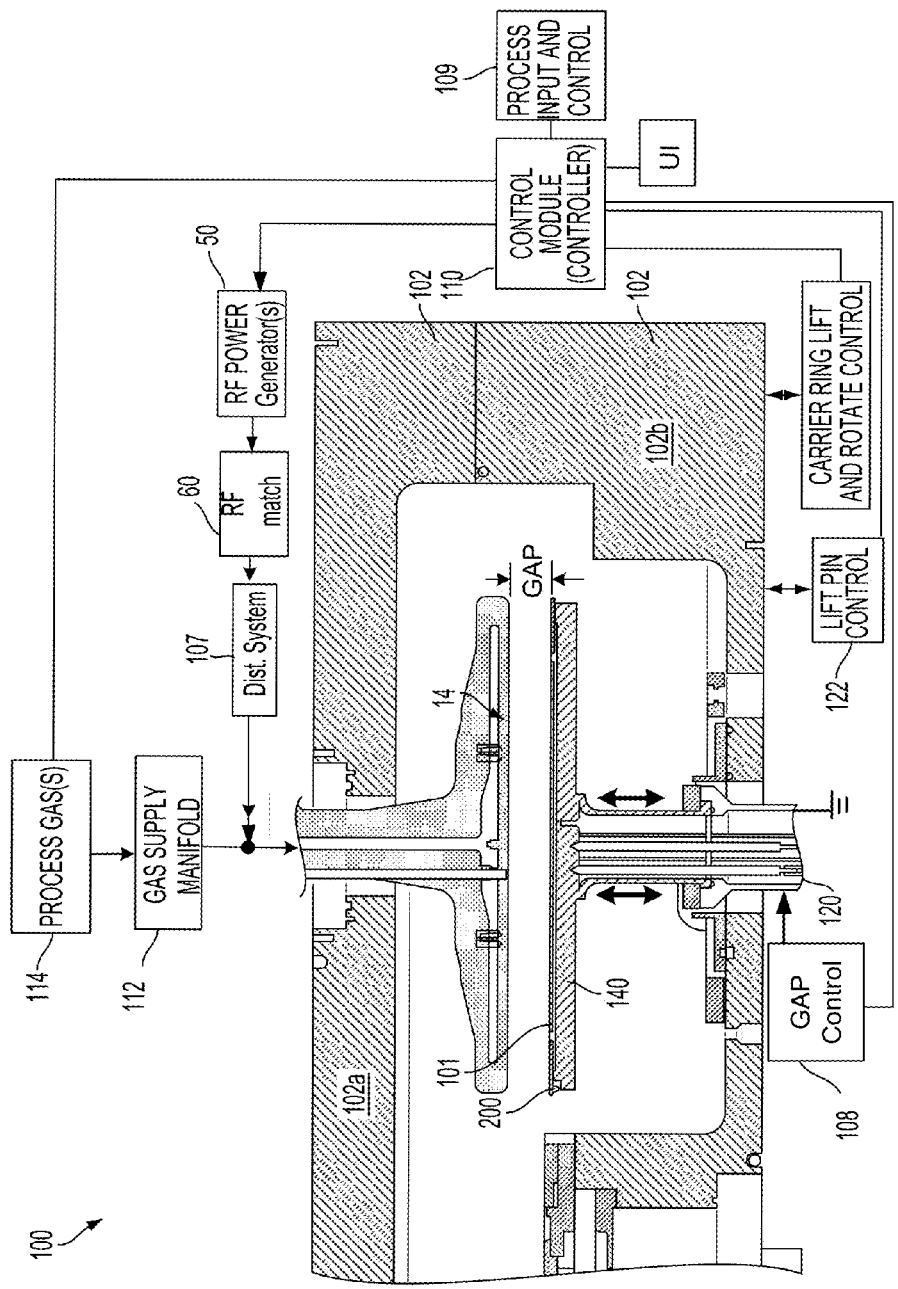
FIG. 2 illustrates an example chamber that includes a gap control to change inter-electrode gap, in accordance with one embodiment of the present invention.

FIG. 2 illustrates a substrate processing system 100, which is used to process a wafer 101. The system includes a chamber 102 having a lower chamber portion 102b and an upper chamber portion 102a. A center column is configured to support a pedestal 140, which in one embodiment is a grounded electrode. A showerhead 14 is electrically coupled to power supply (e.g., one or more RF power generators 50) via an RF match 60. The power supply 50 is controlled by a control module 110, e.g., a controller. The control module 110 is configured to operate the substrate processing system 100 by executing process input and control 109. The process input and control 109 may include process recipes, such as power levels, timing parameters, process gasses, mechanical movement of the wafer 101, etc., such as to deposit or form films over the wafer 101.

The center column is also shown to include lift pins 120, which are controlled by lift pin control 122. The lift pins 120 are used to raise the wafer 101 from the pedestal 140 to allow an end-effector to pick the wafer and to lower the wafer 101 after being placed by the end end-effector. The substrate processing system 100 further includes a gas supply manifold 112 that is connected to process gases 114, e.g., gas chemistry supplies from a facility. Depending on the processing being performed, the control module 110 controls the delivery of process gases 114 via the gas supply manifold 112. The chosen gases are then flown into the shower head 14 and distributed in a space volume defined between the showerhead 14 face that faces the wafer 101, and the wafer 101 rests over the pedestal 140.

Figure 3:
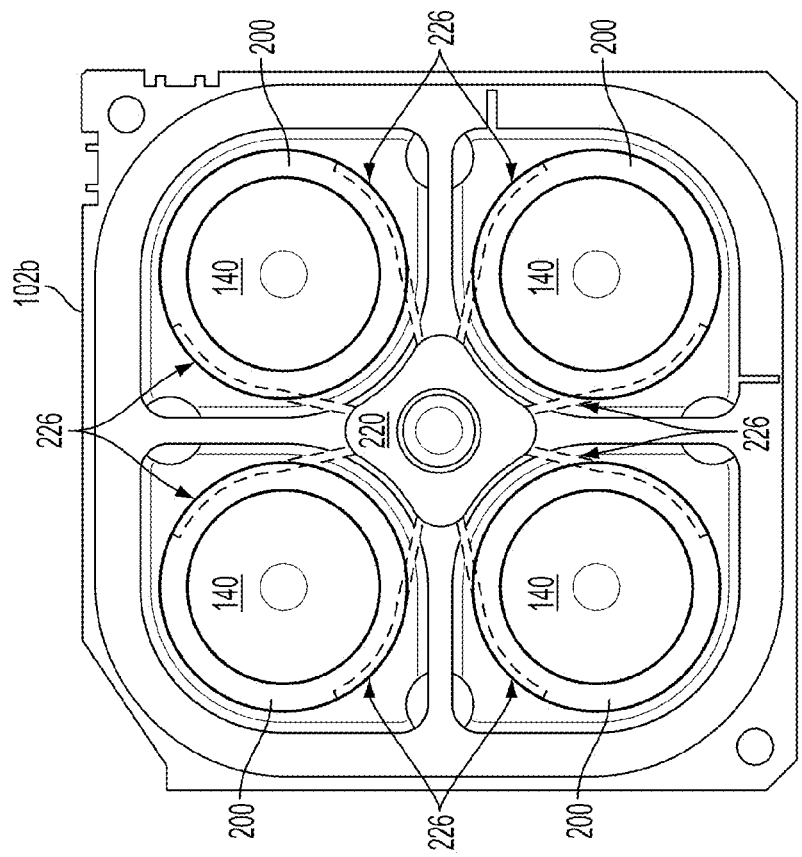

The RF match 60 may be coupled to an RF distribution system 107 that provides the RF power to the system 100. For example, if system 100 is one station of a set of stations as shown in FIG. 3 below, then the RF distribution system 107 is used to provide the RF power to showerhead 14, during operation. In operation, the control module 110 is configured to communicate with gap control 108, which is designed to move the pedestal 140 in a vertical direction up or down.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system.

FIG. 3 illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork includes a first and second arm, each of which is positioned around a portion of each side of the pedestal 140. In this view, the spider forks 226 are drawn in dash-lines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101.

As discussed above, the gap of each station 1, 2, 3, and 4 can be set to different gap settings. For example, station 1 can be set at a gap of 20 mm, station 2 can be set at a gap of 16 mm, station 3 can be set at a gap of 14 mm, and station 4 can be set at a gap of 10 mm. These gap settings are exemplary, and the uniformity profile produced by each gap will depend on other process parameters, such as chamber pressure, temperature, flow rates, deposition gases and other specific deposition recipes. For each gap change or setting the deposition recipe can be fixed except for the gap change or can be fine-tuned to compensate the gap-induced changes in the deposited film. The profiles, for each gap setting can, for example, be stored in a database. Thus, for the desired uniformity or profile, a computer can identify two or more deposition steps for the layer, using two or more chambers or two or more gap settings. It should be noted that the inter-electrode gap can also be changed for a single chamber and the varying or changing from gap to gap can occur in between active deposition or during the deposition process. Additionally, using various signal processing techniques (such as Fourier decomposition, Taylor's series decompositions or similar transforms) the desired uniformity profile can be decomposed into various wave-like profiles and matched/compared against the stored database for the profile selection.

Figure 4:
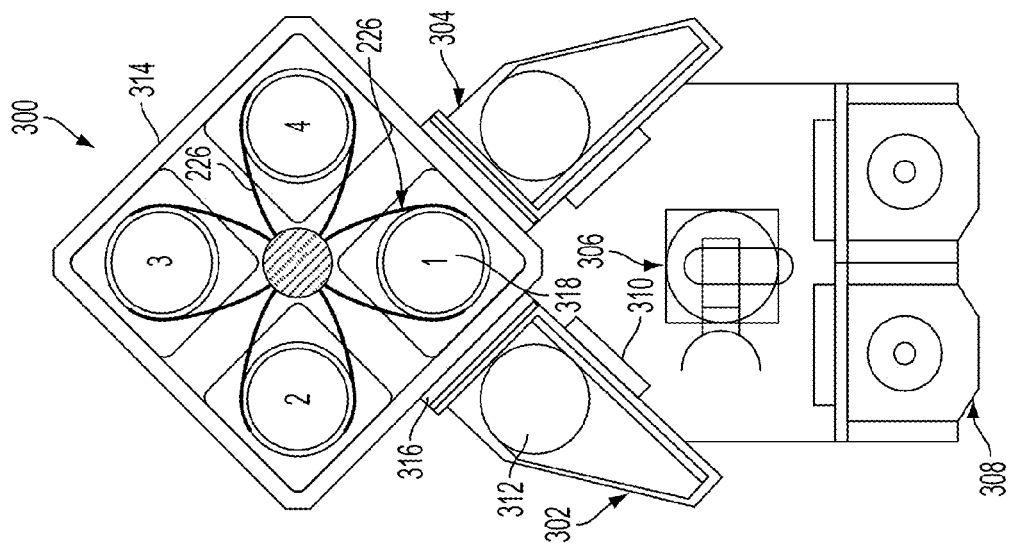
FIGS. 3 and 4 illustrate top views of a multi-station processing tool, wherein four processing stations are provided, in accordance with one embodiment of the present invention.

FIG. 4 shows a schematic view of an embodiment of a multi-station processing tool 300 with an inbound load lock 302 and an outbound load lock 304. A robot 306, at atmospheric pressure, is configured to move substrates from a cassette loaded through a pod 308 into inbound load lock 302 via an atmospheric port 310. Inbound load lock 302 is coupled to a vacuum source (not shown) so that, when atmospheric port 310 is closed, inbound load lock 302 may be pumped down. Inbound load lock 302 also includes a chamber transport port 316 interfaced with processing chamber 314. Thus, when chamber transport port 316 is opened, another robot (not shown) may move the substrate from inbound load lock 302 to a pedestal 140 of a first process station for processing.

The depicted processing chamber 314 comprises four process stations, numbered from 1 to 4 (i.e., station S1, S2, S3 and S4) in the embodiment shown in FIG. 4. In some embodiments, processing chamber 314 may be configured to maintain a low pressure environment so that substrates may be transferred using a carrier ring 200 among the process stations without experiencing a vacuum break and/or air exposure. Each process station depicted in FIG. 4 includes a process station substrate holder (shown at 318 for station 1) and process gas delivery line inlets.

FIG. 5 illustrates an example of a plurality of gap settings A-H, and corresponding uniformity profiles. The uniformity profiles, for deposited materials, achieved for specific gap setting may be measured across an X-axis or a Y-axis of a wafer. Typically, the Y-axis is measured along the diameter of a wafer from the location of the wafer notch. The X-axis is perpendicular to the Y-axis. For purposes of discussion, the graphs shown in FIG. 5 may be taking from either the X or Y axis, depending upon the measured settings.

These illustrative graphs, however, are simply provided to show how varying the gap can have significant changes in uniformity profile, even when the process recipe stays the same in a chamber. For example, the uniformity profile from edge to edge of the wafer can have a dome shape when gap A is set. For instance, gap B may be a smaller gap than A, and the changing gap may potentially produce an opposite effect to the uniformity profile.

For sake of illustration, the opposite effect is drawn to be identically opposite, but in normal processing, each uniformity profile may have its own characteristic between the edges of the wafer. Nevertheless, it is possible to identify certain uniformity profiles produced by certain gaps that can potentially offset or cancel out the non-uniformity effects of certain gaps. Therefore, by depositing part of the material layer when the gap setting is set to gap A, and then switching the gap to gap B for the remainder of the deposition of the material, may act to produce a resulting more uniform profile across the wafer.

Similar examples can also be made by depositing part of a material layer with a gap C, followed by depositing the remaining part of the material layer with gap D. The same can be said for processing depositions with gaps E and then gap F, and gap G and then gap H. In some embodiments, the amount of material layer deposited with a first gap setting can be more or less than the amount of material layer deposited with a second gap setting. For instance, 20% of the material can be deposited using gap A, and then 80% of the material can be deposited using gap B, or the opposite, or in any range or distribution between 1% and 99%.

In other embodiments, more than two gaps can be used for depositing a material layer. For example, 10% of the material layer can be deposited using gap D, followed by 60% of the material deposited using gap G, followed by 20% of the material deposited using gap A, and 10% of the material deposited using gap B. This recipe can be quantified as a gap changing recipe for depositing a material layer, wherein films of the material layer are deposited one over the other using different gaps.

In this example the gap progression was D→G→A→B, wherein different percentages of the material layer can be deposited in each of the gap deposition phases. In some embodiments, the resulting or targeted uniformity profile may be one that is not fully uniform. Achieving this target profile can also be achieved by selecting specific gaps or sequence of gaps during the deposition of a material layer or films. It should be appreciated that the different gaps can be set in a single chamber, e.g., by varying the height of the pedestal, or by setting different gaps in different pedestals of a multi-station chamber (e.g., as shown in FIGS. 3 and 4).

In some embodiments, a method includes performing a plurality of deposition operations to deposit films on a test substrate to deposit the material layer. Each film is deposited using a different gap between the substrate support electrode and the showerhead electrode. The method includes identifying a uniformity profile for each of the deposition operations and saving the uniformity profile for each of the deposition operations to a database. The database 404 includes corresponding gaps between the substrate support electrode and the showerhead electrode and uniformity profiles. The first and second gaps are associated with the first and second uniformity profiles.

In some embodiments, a method includes modeling a plurality of deposition operations to deposit films of the material layer. Each film is deposited using a different gap between the substrate support electrode and the showerhead electrode and saving a uniformity profile for each of the deposition operations to a database. The database 404 includes corresponding data for gaps between the substrate support electrode and the showerhead electrode and uniformity profiles. The first and second gaps are associated with the first and second uniformity profiles. In some embodiments, a mix of physically measured test wafers and modeled wafers can be used to predict or select gaps for processing.

FIG. 6 illustrates a flow diagram of a system 400 that utilizes information from a plurality of stored profiles, and uses the profiles to achieve a target uniformity for a material layer deposited over a semiconductor wafer. In this example, system 400 includes a profile database 404 that receives uniformity profiles for a plurality of gap settings, as associated with specific depositions of materials. For example, the profile database 404 can include a table of materials that can be deposited and the recipes utilize for deposition of the materials. The table can include information regarding recipe settings, material settings, temperature settings, power level settings, timing settings, etc.

In addition, the table will include information regarding the non-uniformity profiles for each specific corresponding gap setting for the specific recipes of the materials identified. In one embodiment, the profile database 404 can be constructed from a plurality of deposition operations that are tested to identify the uniformity profiles that results based on the gap settings. This information can also be augmented or grown over time based on future testing or testing done during future deposition operations. The profile database 404 can therefore grow over time and be refined to avoid or reduce error associated with predicting anticipated uniformity or non-uniformity profile associated with a selected gap between the top and bottom electrodes for specific deposition recipes. Various signal processing techniques can be incorporated to identify the constituent profiles to have a resultant desired thickness uniformity profile.

In operation, a deposition sequence can include the identification 408 of materials that are to be deposited over a semiconductor substrate. Once the material to be deposited is identified, the desired uniformity profile is identified in operation 410. The identification of operations 408 and 410 can also be done simultaneously or entered into a system or user interface. A controller or system computer 406 can then look-up in the profile database 404 to identify two or more gaps for achieving the desired uniformity profile and for depositing the identified material. An operator/engineer can also look-up profiles and select a combination of profiles based on their knowledge and desired resulting profile.

In operation 412, the controller 406 will identify gap settings for two or more deposition phases used to deposit the identified material over the semiconductor wafer. In operation 414, the gap information and timing associated with the period of time during which each deposition phase is to occur is passed to the processing system (chamber or controller of the chamber), so as to enable deposition of material over the substrate in two or more phases, with each phase having a chamber set to a predefined electrode gap.

Figure 7:
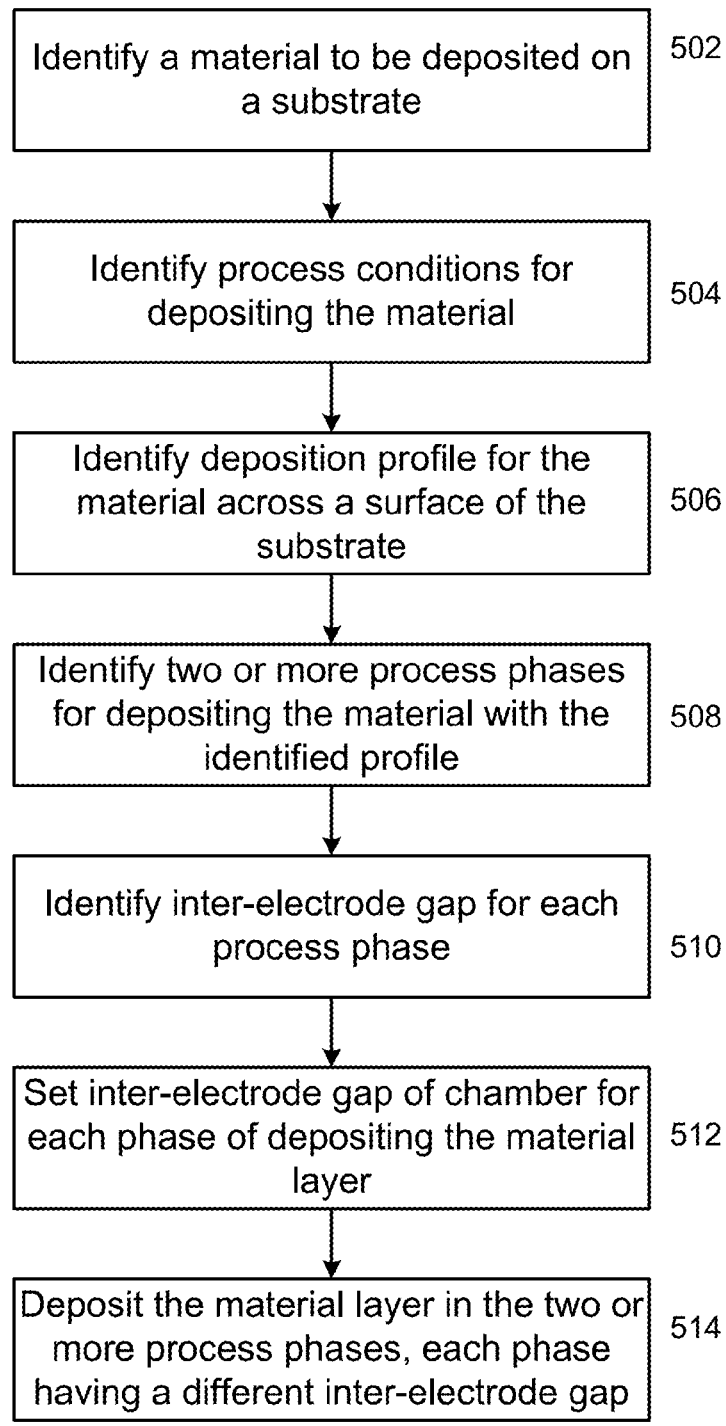
FIGS. 7 and 8 illustrate flowchart diagrams for illustrating method operations performed for selecting inter-electrode gaps for phases of deposition, in accordance with one embodiment of the present invention.

FIG. 7 illustrates a flowchart identifying operations for identifying inter-electrode gaps for depositing a material layer over a semiconductor substrate. In operation 502, a material to be deposited on a substrate is identified. In operation 504, process conditions for depositing the material are identified. The process conditions can include specific recipes parameters for performing the desired deposition of the material. As noted above, the recipe parameters can include chamber pressure, chamber temperature, time frames for depositing the material to achieve certain thicknesses, power levels delivered to the electrodes, and other settings.

In operation 506, the system will identify or the operator will identify a deposition profile for the material across the surface of the substrate that is desired. The deposition profile can be substantially uniform, or can include non-uniformities due to anticipated etching non-uniformities that will occur subsequently to the deposition. In operation 508, the controller or system operator will identify two or more process phases for depositing the material with the identified desired profile. The two or more phases can include multiple deposition films designed to achieve the target thickness of the material layer to be deposited. Each phase of deposition can be identified for the amount of time needed or percentage of the deposition phase relative to other deposition phases. In operation 510, the inter-electrode gap for each of the process phases is identified. The inter-electrode gap is identified by, for example, knowing the anticipated or likely profile to be achieved with the specific gap.

In one embodiment, the anticipated or expected profile can be obtained from a database. In some configurations, multiple phases are processed with multiple gaps so that non-uniformities of a specific gap are offset or canceled out by the non-uniformities of subsequent gaps. In operation 512, the inter-electrode gap of each chamber for each phase of deposition of the material is set. Setting of the inter-electrode gap can be processed by having the controller of the system communicate with a gap control 108 (see FIG. 2), which allows for the pedestal to move up or down to the desired gap setting. In operation 514, the material layer is deposited in two or more process phases. Each process phase will have a different inter-electrode gap so that the resulting material layer deposited by the two or more phases will achieve the desired uniformity profile set in operation 506.

Figure 8:
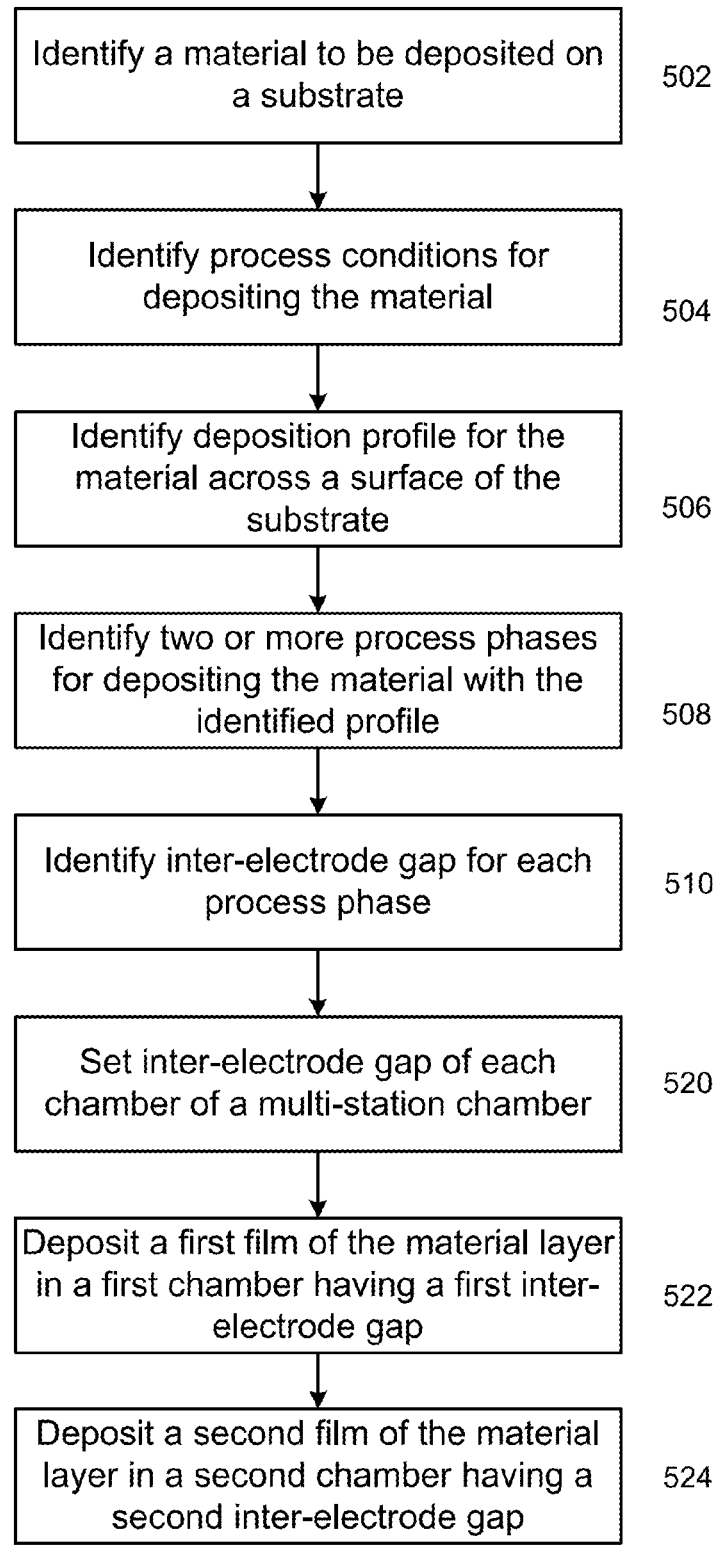

FIG. 8 illustrates an example process flow similar to FIG. 7 in operations 502-510, in accordance with one embodiment. In operation 520, the inter-electrode gap of each chamber is set in the context of a multi-station chamber. The multi-station chamber may be one of the chambers illustrated in FIGS. 3 and 4 above. Each chamber is considered a station, and each station can have its respective pedestal adjusted with a gap control 108 to set the desired gap.

In this configuration, a partial amount of the material layer can be deposited (i.e. a film of the material layer) in one station, and then the substrate is moved to the next station where a partial amount of the material layer can be deposited or the remaining amount can be deposited. In some embodiments, the material layer can be deposited in four steps, e.g. a portion in each of the stations, or in two steps, e.g. a portion in each station, or in three steps, e.g. a portion in each station. Still further, the material layer can be deposited in more than four steps by rotating or moving the wafer around the multi-station chamber where in progressive amounts of the material layer are deposited until the desired thickness has been achieved.

Still further, it should be understood that the amount of material deposited in each station can vary relative to other stations. That is, more or less of the material can be deposited in each of the specific stations, wherein the material deposited in the respective stations will achieve the anticipated profile consistent with the set inter-electrode gaps. For example and with reference to operations 522 and 524, a 1st film of the material layer is deposited in a 1st chamber having a first inter-electrode gap, and a second film of the material layer is deposited in the second chamber having a second inter-electrode gap.

Figure 9:
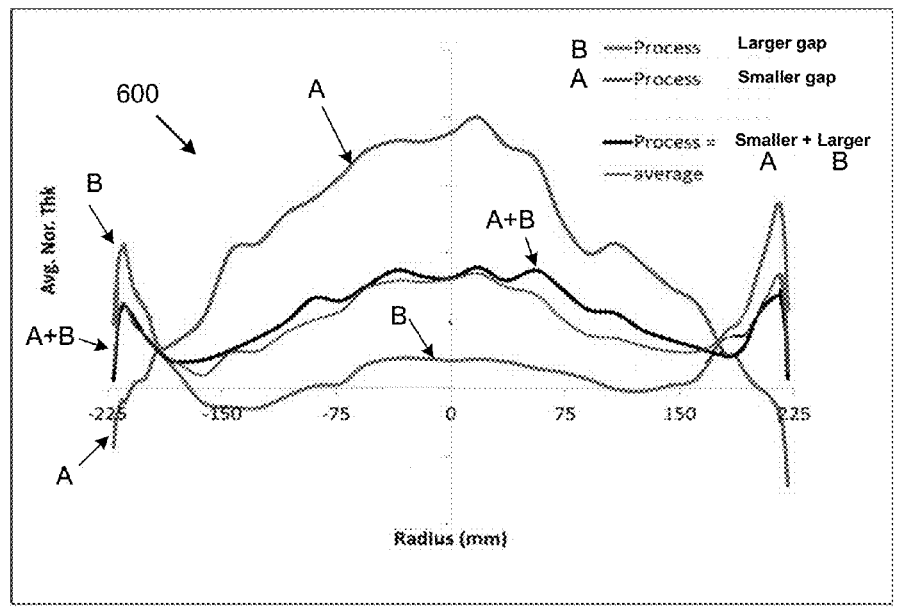
FIGS. 9 and 10 illustrates graphs produced when scanning thicknesses across deposited materials over semiconductor substrates, and resulting advantages associated with combining multiple deposition steps to produce desired uniformity profiles, in accordance with one embodiment.

FIG. 9 illustrates a graph 600 where uniformity profiles are plotted of an actual material deposited over a semiconductor substrate. The graph 600 illustrates in the X axis distances across the substrate, for an example substrate that is 450 mm in diameter. Although the example provided in FIG. 9 relate to a 450 mm wafer or substrate, it should be understood that other sizes of substrates can also utilize the dynamic gap changing for achieving target profiles (e.g. such as 200 mm wafers, 300 mm wafers, etc.).

In the example of FIG. 9, the material being deposited is silicon nitride (SiN). The processing for depositing this material layer has occurred by depositing silicon nitride using a smaller gap (process A), and then switching to a larger gap (process B). In this context, larger and smaller are relative notations to connote changes between one gap and another gap. As shown, the uniformity profile for process A, that uses a smaller gap will exhibit less deposition toward the center of the substrate while also exhibiting wing-type features toward the edges of the substrate. The wing-type features illustrate more deposition near the edges that the center. Once an amount of material is deposited utilizing process A (smaller gap), the gap is changed to a larger gap to enable process B.

Process B will be the process of depositing or continuing to deposit the silica nitride material over the amount of material deposited using process A. In this example, process A illustrates a profile were more deposition occurs toward the center of the wafer and substantially less occurs toward the edges of the wafer. In one embodiment, the result of processing or continuing to deposit the silica nitride material using process A, will counteract or offset some of the non-uniformities that would have been exhibited if a single deposition were to occur with a single gap (i.e., a gap that is not changed). The result of the combined deposition phases will produce process A+B, which is a more uniform profile across the semiconductor substrate.

These measurements were performed across a real substrate after a real deposition process occurred with a smaller gap and a larger gap, and the real results A+B are shown to substantially match a predicted model illustrated as a lighter profile line that is identified as "average." For purposes of example only, the smaller gap was set at approximately 10.87 mm, and the larger gap was set at approximately 16.68 mm. Further, the amount of deposition performed using process A was for 500 Å, and the amount of deposition performed using process B was for 900 Å.

Again it should be understood that these process thicknesses, and gap settings are only exemplary and the profiles will change or be specific to the materials being processed and the recipes utilized during the deposition operations. By modeling a plurality of gaps for specific materials, it is possible to store the profiles that are anticipated for the specific gaps and materials in the database, and then utilized to achieve desired profiles by combining multiple deposition operations that use two or more gaps between the electrodes. For example, for each recipe, there could be several saved profiles, or tens of saved profiles, or hundreds of saved profiles or thousands. In some cases, as more processing is completed on production wafers, measurements can take place to further quantify profiles per the settings. As such, over time, the profile database can grow richer, which will enable selection of profiles to best match a desired profile or uniformity or non-uniformity.

Figure 10:
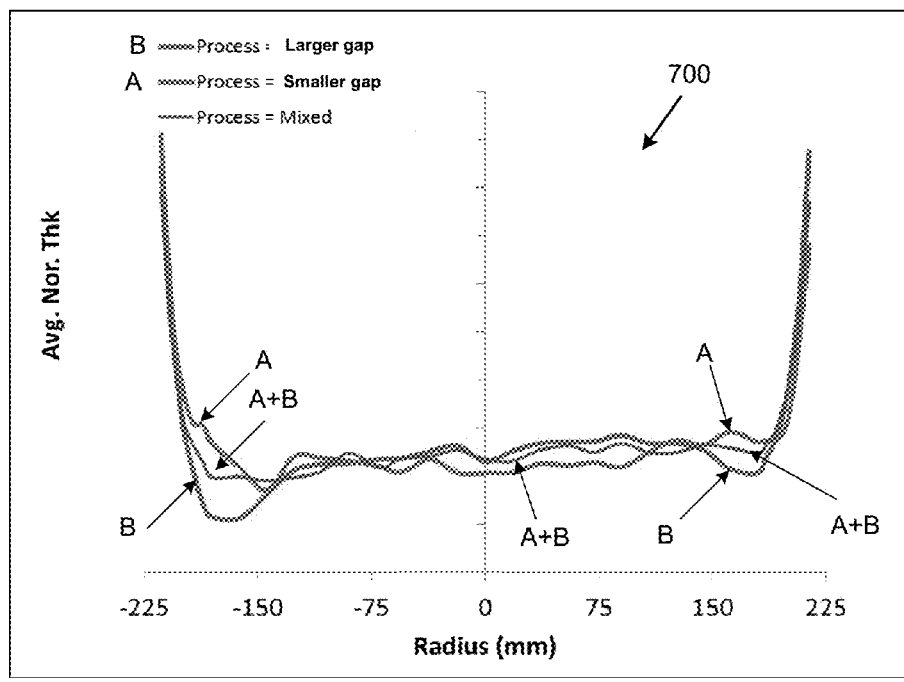

FIG. 10 illustrates another example graph 700 showing uniformity profiles achieved when a smaller gap (process A) is used followed by a larger gap (process B), in accordance with one embodiment of the present invention. In this example, the material layer being deposited is silicon carbide. The silicon carbide material was 1st deposited utilizing process A during 50% of the deposition (target thickness). Next, while the deposition is running the position of the pedestal is changed to a larger gap four running process B, for the remaining 50% of the deposition. Again, for purposes of example only, the smaller gap was set at approximately 10.87 mm, and the larger gap was set at approximately 16.68 mm.

As illustrated in the graph 700, the edges of the semiconductor substrate exhibit more non-uniformities during each of the two deposition phases. In each phase, however, the non-uniformities appear to be substantially opposite of each other. For example, process A with the smaller gap produced more deposition near the edge of the wafer, while process B with the larger gap produced less deposition near the edge of the wafer. Thus, by depositing part of the material layer using a 1st gap setting and then switching to a 2nd gap setting for the remainder of the material deposition, the resulting profile A+B is substantially more uniform.

Figure 11A:
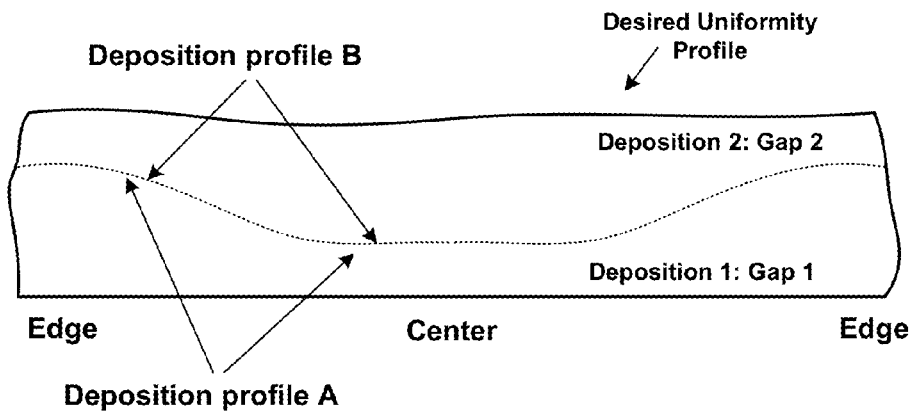
FIGS. 11A-11C illustrate examples of cross-sectional views of materials deposited over a substrate or material on a substrate, in successive deposition operations utilizing different gaps between electrodes to achieve profiles that complement each other or counteract non-uniformities, in accordance with one embodiment.
Figure 11B:
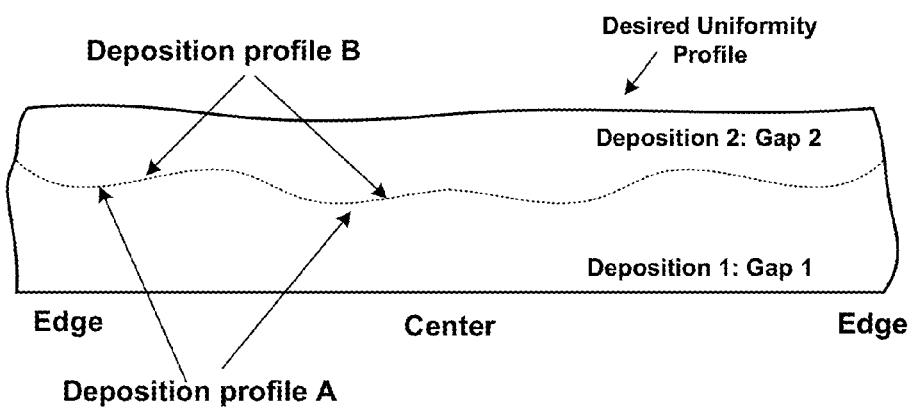
Figure 11C:
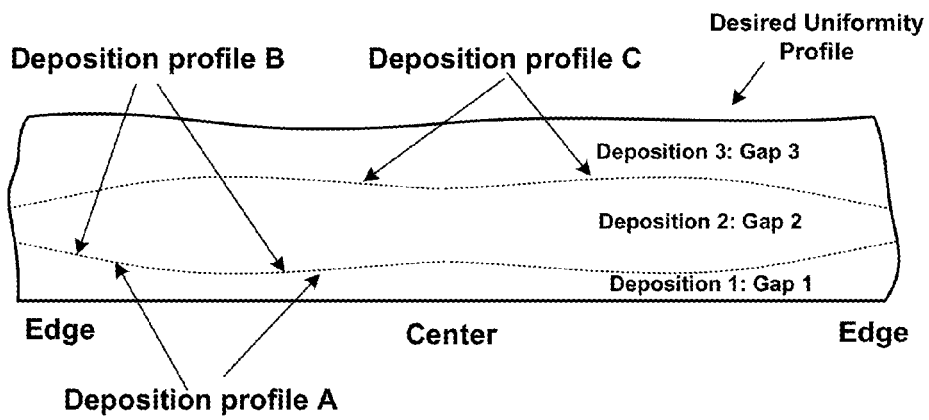

FIGS. 11A-11C illustrate examples of a desired uniformity profile that can be achieved by depositing a material in multiple deposition phases, where each deposition phase will have a deposition profile associated with a gap. These examples of are of a layer of material, formed by multiple films. The layer of material can be deposited over another layer, over a substrate, over patterned layers, the silicon wafer, or over some other substrate layer (not shown). It should be understood a desired target or ending uniformity profile, e.g., for a single layer, by forming multiple films with selected deposition profiles. FIG. 11C below shows, that for a single layer of material, the single layer is formed by depositing three films, where each film has a specific uniformity profile. Although three films are shown in FIG. 11C, it should be understood that a single layer can be formed from many multiple deposition film phases (e.g., two or more) until the resulting film thickness is achieved, e.g., by the complementing successive overlying film materials, each with a specific uniformity profile that is pre-known or pre-characterized. As used herein, pre-known or pre-characterized means that the profile has been measured from previous depositions or modeled (i.e., with varying gaps), and added to a database or file or table for later use, selection or application.

FIG. 11A illustrates an example of a first deposition with gap 1 having a deposition profile A, and then followed by a second deposition profile B to with a gap 2. Profile A has more deposition occurring near the outer edges of the substrate while less deposition occurs near the center of the substrate. Profile B has less deposition near the edges of the substrate and more deposition near the center of the substrate. The result is a desired uniformity profile that combines the two deposition steps to achieve a substantially uniform profile, e.g., when measured across a diameter of a substrate (e.g. 450 mm or 300 mm wafer).

FIG. 11B illustrates an example where the deposition profile B is then substantially matched to a deposition profile A, to achieve the desired uniformity profile. As mentioned above, the deposition profiles can be selected from a database of known profiles based on the recipe and the material being deposited. For these profiles, a gap is associated with the profiles, and the expected profile is achievable based on the selected gap.

FIG. 11C illustrates an example where the material layer is deposited using multiple deposition steps (depositions 1-3). In this example, the first deposition will produce a profile A, the second deposition will produce a profile B, and the third deposition will produce a profile C. in this illustration, the material amount deposited in each deposition step may be less than the amount deposited in the examples and FIGS. 11A-B, while still achieving the target thickness of the material layer. These cross-sectional views have been provided to illustrate that a plurality of the deposition steps with corresponding gaps (e.g., gaps 1, 2, 3) can be performed successively so as to counteract or cancel non-uniformities provided by underlying deposited layers or films. It is again stated that the deposition of each layer and the gap setting can be performed in a single chamber or using multiple chambers, such as the multi-station chamber shown in FIGS. 3 and 4 above.

Figure 12:
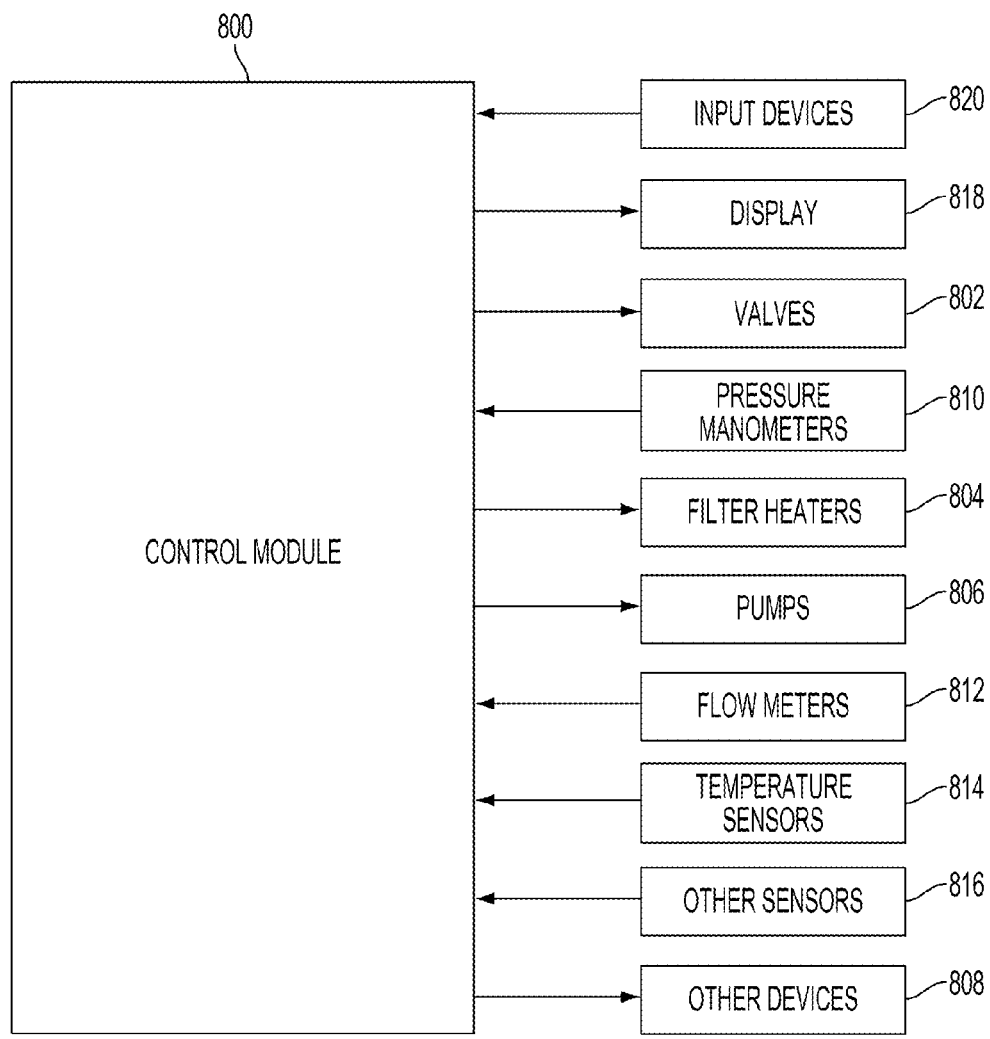
FIG. 12 shows a control module for controlling the systems, in accordance with one embodiment.

FIG. 12 shows a control module 800 for controlling the systems described above, including the gap control 108. In one embodiment, the control module 110 of FIG. 2 may include some of the example components. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during precursor delivery and deposition of the film. The control module 800 will typically include one or more memory devices and one or more processors.

The control module 800 may control activities of the precursor delivery system and deposition apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 800 may also monitor the pressure differential and automatically switch vapor precursor delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 810, and thermocouples located in delivery system, the pedestal or chuck (e.g. the temperature sensors 814). Appropriately programmed feedback and control algorithms may be used with data from these sensors to maintain desired process conditions. The foregoing describes implementation of embodiments of the invention in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, bevel-edge deposition chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for depositing a material layer over a substrate, the depositing being performed in a plasma chamber having a bottom electrode and a top electrode, comprising, providing a substrate over the bottom electrode in the plasma chamber;

setting a first gap between the bottom and top electrodes by adjusting a vertical position of the top electrode;

performing plasma deposition to deposit a first film of the material layer over the substrate while the first gap is set between the bottom and top electrodes;

setting a second gap between the bottom and top electrodes by adjusting a vertical position of the top electrode;

performing plasma deposition to deposit a second film of the material layer over the substrate while the second gap is set between the bottom and top electrodes;

wherein the material layer is defined by the first and second films, and the first gap is varied to the second gap to offset pre-characterized non-uniformities when depositing the first film followed by the second film.

2. The method of claim 1, wherein depositing the second film using the second gap acts to offset the pre-characterized non-uniformities when pre-characterized non-uniformities associated with depositing using the second gap are opposite in direction or magnitude than pre-characterized non-uniformities associated with depositing using the first gap.

3. The method of claim 1, wherein performing the plasma deposition of the first film using the first gap is pre-known to experience a first non-uniformity;

wherein performing the plasma deposition of the second film using the second gap is pre-known to experience a second non-uniformity;

wherein the second non-uniformity is identified to cancel out or offset at least part of the first non-uniformity.

4. The method of claim 2, wherein pre-characterized non-uniformities for the first gap and the second gap are associated with measurement data or modeled data for the first and second gaps, and wherein the first gap and the second gap are selected based on a target profile of uniformity for said material layer.

5. The method of claim 1, wherein the material layer is defined by an additional third film, the additional third film being deposited using a third gap between the bottom and top electrodes;

wherein the third gap is set by varying the second gap to the third gap by adjusting a vertical position of the top electrode.

6. The method of claim 1, wherein the plasma chamber having the set first gap is the same as the plasma chamber having the set second gap.

7. The method of claim 1, wherein the plasma chamber having the set first gap is different than the plasma chamber having the set second gap.

8. The method of claim 1, further comprising, moving the substrate between the plasma chamber having the first gap to the plasma chamber having the second gap during deposition of the material layer.

9. The method of claim 1, wherein the pre-characterized non-uniformities have characteristics that are associated with near wafer edge and center wafer profile variations.

10. The method of claim 1, wherein the pre-characterized non-uniformities have characteristics that include wing non-uniformities, or W-shaped non-uniformities, or valley-shaped non-uniformities, or dome-shaped non-uniformities, or ripple-shaped non-uniformities, or combinations of two or more thereof.

* * * * *